(12) United States Patent
Wu (10) Patent No.: US 11,404,680 B2
(45) Date of Patent: Aug. 2, 2022

(54) PIXEL BANK MANUFACTURING METHOD, PIXEL BANK STRUCTURE, PIXEL STRUCTURE, AND DISPLAY PANEL

(71) Applicant: Shenzhen China Star Optoelectronics Semiconductor Display Technology Co., Ltd., Shenzhen (CN)

(72) Inventor: Xiaoling Wu, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 164 days.

(21) Appl. No.: 16/759,743

(22) PCT Filed: Apr. 22, 2020

(86) PCT No.: PCT/CN2020/086152
§ 371 (c)(1),
(2) Date: Apr. 28, 2020

(87) PCT Pub. No.: WO2021/164120
PCT Pub. Date: Aug. 26, 2021

(65) Prior Publication Data
US 2021/0408507 A1 Dec. 30, 2021

(30) Foreign Application Priority Data
Feb. 20, 2020 (CN) .......................... 202010105858.X (51) Int. Cl.
*H01L 27/32* (2006.01)
*H01L 51/52* (2006.01)
*H01L 51/56* (2006.01)

(52) U.S. Cl.
CPC .......... *H01L 51/56* (2013.01); *H01L 27/3246* (2013.01); *H01L 27/3283* (2013.01); *H01L 51/5284* (2013.01)

(58) Field of Classification Search
CPC ............. H01L 27/3246; H01L 27/3283; H01L 51/5284
See application file for complete search history.

(56) References Cited

U.S. PATENT DOCUMENTS

2009/0078941 A1* 3/2009 Tsai .................... H01L 27/3246
257/72
2014/0332763 A1* 11/2014 Kim .................... H01L 51/5262
257/40
(Continued)

FOREIGN PATENT DOCUMENTS

| CN | 105118928 | 12/2015 |
| CN | 105794322 | 7/2016 |

(Continued)

*Primary Examiner* — Fernando L Toledo
*Assistant Examiner* — Valerie N Newton (57) ABSTRACT

A pixel bank manufacturing method, a pixel bank structure, a pixel structure, and a display panel are provided. The method includes providing a base substrate, wherein a plurality of anode thin film layers are manufactured on the base substrate; coating a photoresist layer used for covering the plurality of anode thin film layers on the base substrate; performing a photolithography on the photoresist layer by an exposing patterning structure, and baking to cure a remained photoresist layer after the photolithography to form a first bank layer; the exposing patterning structure is a structure that full via holes, first half via holes, a plurality of blind via holes, and second half via holes are arranged repeatedly; forming a second bank layer on the first bank layer; the second bank layer is a black bank layer.

13 Claims, 4 Drawing Sheets

(56) References Cited

U.S. PATENT DOCUMENTS

| | | |
|---|---|---|
| 2016/0372528 A1 | 12/2016 | Kamura et al. |
| 2017/0033164 A1 | 2/2017 | Liu |
| 2017/0373124 A1 | 12/2017 | Yang et al. |
| 2018/0033847 A1 | 2/2018 | Kim et al. |
| 2019/0096968 A1 | 3/2019 | Zhang et al. |
| 2019/0206963 A1 | 7/2019 | Zhang et al. |
| 2020/0110337 A1 | 4/2020 | Tanigaki et al. |
| 2020/0127056 A1 | 4/2020 | Guo et al. |

FOREIGN PATENT DOCUMENTS

| | | |
|---|---|---|
| CN | 106531766 | 3/2017 |
| CN | 107665906 | 2/2018 |
| CN | 107706222 | 2/2018 |
| CN | 108231840 | 6/2018 |
| CN | 108987431 | 12/2018 |
| CN | 109148718 | 1/2019 |
| CN | 109801939 | 5/2019 |
| CN | 110392864 | 10/2019 |
| JP | 2007-294118 | 11/2007 |

\* cited by examiner

PIXEL BANK MANUFACTURING METHOD, PIXEL BANK STRUCTURE, PIXEL STRUCTURE, AND DISPLAY PANEL

RELATED APPLICATIONS

This application is a National Phase of PCT Patent Application No. PCT/CN2020/086152 having International filing date of Apr. 22, 2020, which claims the benefit of priority of Chinese Patent Application No. 202010105858.X filed on Feb. 20, 2020. The contents of the above applications are all incorporated by reference as if fully set forth herein in their entirety.

FIELD AND BACKGROUND OF THE INVENTION

The present disclosure relates to the field of organic light emitting diode (OLED) display technologies, and particularly relates to a pixel bank manufacturing method, a pixel bank structure, a pixel structure, and a display panel.

With development of organic light emitting diode (OLED) display technologies, performance of OLED display panels are increasingly higher, and their quality are also increasingly better. During production and manufacturing processes of the OLED display panels, ink printing technologies are used. However, because monochromatic light of ink printing devices from the used ink printing technologies is not pure, a layer of color filter is needed to be added on the ink printing devices to improve the color purity of pixels. The additional color filter will cause an aperture ratio of the pixels to increase, and when widths of black matrices (BMs) are lowered, it will cause light leakage between the pixels.

Currently, pixel banks (spacers) are disposed between pixels to lower light leakage between the pixels. However, in implementation processes, the applicant found that there are at least the following problems in the prior art: light leakage may still occur on pixel banks in the prior art, and production cost is high.

SUMMARY OF THE INVENTION

Based on this, it needs to aim at the problems, that is, light leakage may still occur on pixel banks in the prior art and the production cost is high, to provide a pixel bank manufacturing method, a pixel bank structure, a pixel structure, and a display panel.

A pixel bank manufacturing method, including the following steps:

Providing a base substrate, and a plurality of anode thin film layers are manufactured on the base substrate.

Coating a photoresist layer used for covering the plurality of anode thin film layers on the base substrate.

Performing a photolithography on the photoresist layer by an exposing patterning structure, and baking to cure a remained photoresist layer after the photolithography to form a first bank layer. The exposing patterning structure is a structure that a plurality of full via holes, a plurality of first half via holes, a plurality of blind via holes, and a plurality of second half via holes are arranged repeatedly.

Forming a second bank layer on the first bank layer. The second bank layer is a black bank layer.

A pixel bank structure, including a first bank layer and a second bank layer. A thickness of a middle section of the first bank layer is greater than a thickness of an edge section of the first bank layer.

The middle section of the first bank layer covers a gap section between two adjacent anode thin film layers on the base substrate, and the edge section of the first bank layer covers an edge section of a plurality of anode thin film layers.

The second bank layer covers the first bank layer.

A pixel structure, wherein organic light emitting diode (OLED) devices are formed in a pixel bank structure.

The pixel bank structure includes:

A first bank layer and a second bank layer, furthermore, a thickness of a middle section of the first bank layer is greater than a thickness of an edge section of the first bank layer.

The middle section of the first bank layer covers a gap section between two adjacent anode thin film layers, and the edge section of the first bank layer covers an edge section of a plurality of anode thin film layers.

The second bank layer covers the first bank layer

The pixel bank manufacturing method provided by each embodiment of the present disclosure are through steps as follow: providing a base substrate, wherein a plurality of anode thin film layers are manufactured on the base substrate; coating a photoresist layer used for covering the plurality of anode thin film layers on the base substrate; performing a photolithography on the photoresist layer by an exposing patterning structure, and baking to cure a remained photoresist layer after the photolithography to form a first bank layer; the exposing patterning structure is a structure that a plurality of full via holes, a plurality of first half via holes, a plurality of blind via holes, and a plurality of second half via holes are arranged repeatedly; forming a second bank layer on the first bank layer; the second bank layer is a black bank layer. By the full via holes, the first half via holes, the blind via holes, and the second half via holes of the exposing patterning structure, using light with different intensities to perform the photolithography on the photoresist layer can be realized, so the thickness of the middle section of the formed first bank layer is thick, and the thickness of the edge section of the formed first bank layer is thin. After that, forming the second bank layer on the first bank layer, because the thickness of the middle section of the first bank layer is thick, a height of the second bank layer is raised. Furthermore, a characteristic of shielding light by a black color of the second bank layer is used to reduce a risk of light leakage. Moreover, because the pixel bank manufacturing method of the present disclosure omits ashing processes in traditional bank manufacturing process, production and manufacturing cost is lowered, and production and manufacturing time is reduced.

DESCRIPTION OF SPECIFIC EMBODIMENTS OF THE INVENTION

For ease of understanding of the present disclosure, the present disclosure will be described more fully hereinafter with reference to the accompanying drawings. The preferred embodiments of the present disclosure are shown in the accompanying drawings. However, the present disclosure can be implemented in many different ways and is not limited to the embodiments described herein. Rather, the purpose of providing these embodiments is to make the disclosed contents of the present disclosure more thorough and comprehensive.

It should be noted that when a component is considered to be connected to another component, it can be directly connected to another component and can be combined with it into one body, or a centering component may simultaneously exist. The terms "mounted", "one end", "another end" or other similar expressions used herein are only for the purpose of description.

Unless defined otherwise, all technical and scientific terms used herein have the same meaning as commonly understood by one of ordinary skill in the art to which present disclosure belongs. The terms used herein in the specification of the present disclosure are only for the purpose of describing specific embodiments, and are not intended to limit the present disclosure. The terms used herein, "and/or", include any and all combinations of one or more of the associated listed items.

Figure 1:
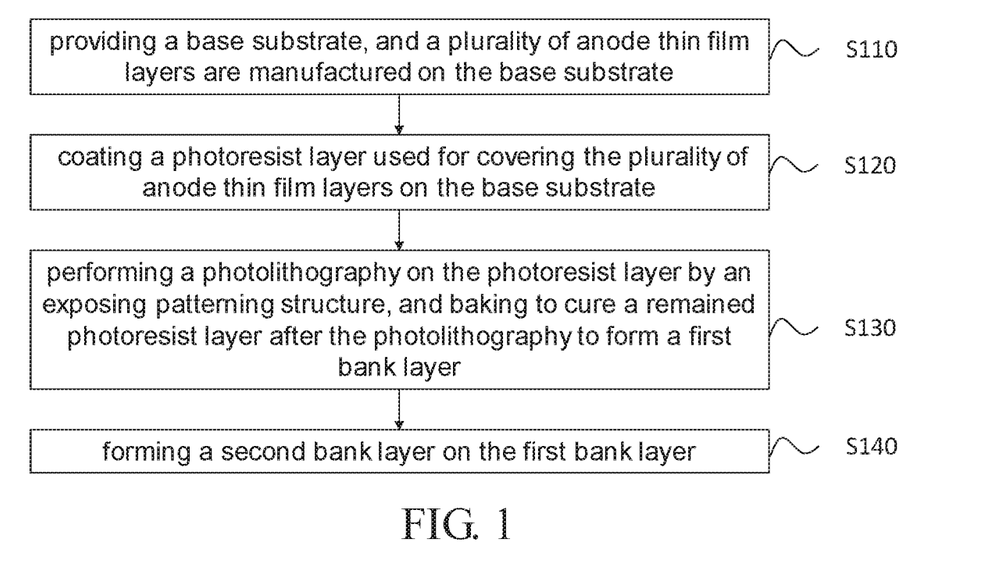
FIG. 1 is a flowchart of the pixel bank manufacturing method of an embodiment.
Figure 2:
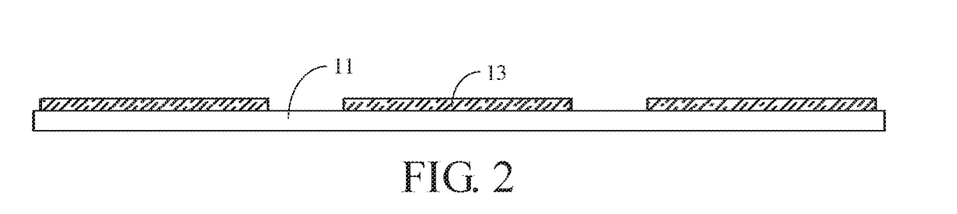
FIG. 2 is a process schematic diagram of manufacturing a base substrate of an embodiment.

In order to solve the problems that light leakage may still occur on traditional pixel banks and production cost is high, in an embodiment, as illustrated in FIG. 1, a pixel bank manufacturing method is provided, and it includes steps as follow:

Step S110: providing a base substrate 11, and a plurality of anode thin film layers 13 are manufactured on the base substrate 11 (shown in FIG. 2).

It should be noted that the base substrate 11 is a carrying substrate of organic light emitting diode (OLED) devices and OLED encapsulation structures, and it is a transparent substrate. The base substrate 11 can use but is not limited to the following materials: polyimide, polyethylene terephthalate, polyethylene naphthalate, polycarbonate, polyethersulfone, glass, or quartz. In the present disclosure, first forming the anode thin film layers 13 on the base substrate 11. Furthermore, the anode thin film layers 13 are used to produce electron holes. The anode thin film layers 13 are made by using but is not limited to an indium tin oxide (ITO) material. For example, the material of the anode thin film layers 13 is ITO/Ag/ITO.

Step S120: coating a photoresist layer 15 used for covering the plurality of anode thin film layers 15 on the base substrate 11 (as shown in FIG. 2).

Figure 3:
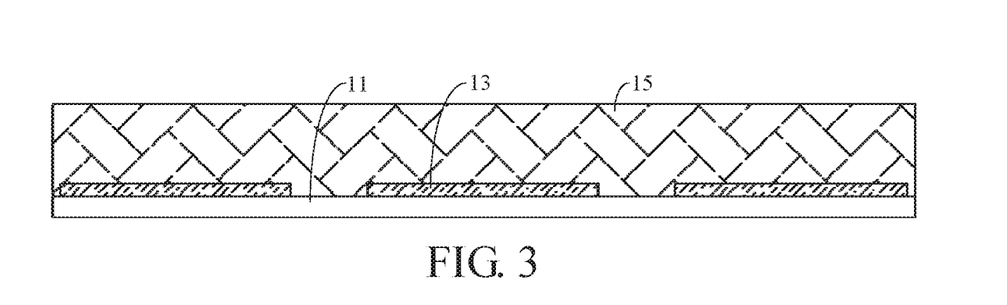
FIG. 3 is a process schematic diagram of manufacturing a photoresist layer of an embodiment.

It should be noted that after forming the anode thin film layers 13 on the base substrate 11, coating the photoresist layer 15 on the base substrate 11, and the photoresist layer 15 covers the anode thin film layers 13. Furthermore, a material of the photoresist layers 15 is mixed from a resin, a photosensitizer, and a solvent. Furthermore, a material of the photoresist layer 15 can be a positive photoresist material, and can also be a negative photoresist material, wherein the positive photoresist material is that a part illuminated by light can dissolve in a photoresist developer, and the part not illuminated by light is unable to dissolve in the photoresist developer. The negative photoresist is that a part illuminated by light is unable to dissolve in the photoresist developer, and the part not illuminated by light can dissolve in a photoresist developer.

Figure 4:
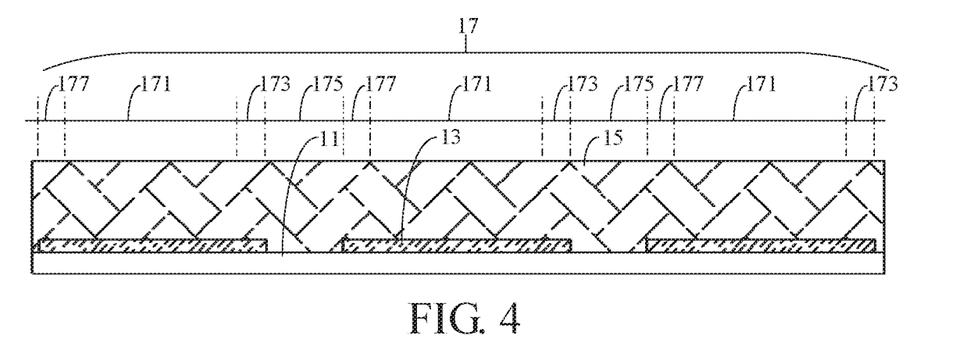
FIG. 4 is a process schematic diagram of manufacturing an exposing patterning structure of an embodiment.
Figure 5:
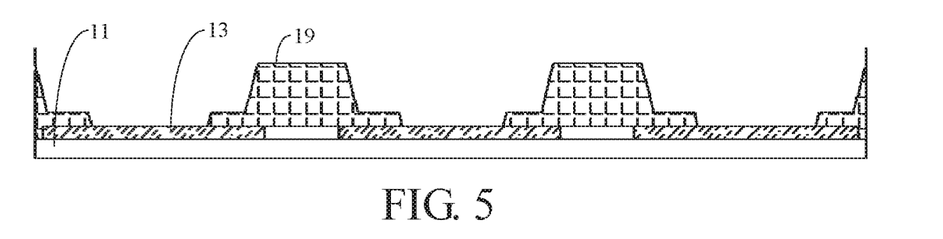
FIG. 5 is a process schematic diagram of manufacturing a first bank layer of an embodiment.
Figure 6:
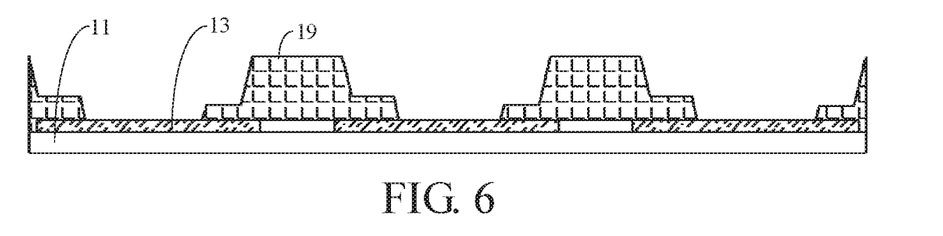
FIG. 6 is a process schematic diagram of manufacturing a first bank layer of another embodiment.

Step S130, performing a photolithography on the photoresist layer 15 by an exposing patterning structure 17 (as shown in FIG. 4), and baking to cure a remained photoresist layer 15 after the photolithography to form a first bank layer 19 (as shown in FIG. 5 or FIG. 6). The exposing patterning structure 17 is a structure that a plurality of full via holes 171, a plurality of first half via holes 173, a plurality of blind via holes 175, and a plurality of second half via holes 177 are arranged repeatedly.

It should be noted that after coating the photoresist layer 15, performing the photolithography and the baking on the photoresist layer 15 to form the first bank layer 19. Specifically, the photoresist layer 15 is illuminated by the exposing patterning structure 17 including the full via holes 171, the first half via holes 173, the blind via holes 175, and the second half via holes 177 which are sequentially arranged repeatedly. In an embodiment, light transmittance rates of the first half via holes 173 and the second half via holes 177 are same, so in the photolithography process of the photoresist layer 15, lights with three intensities illustrate on the photoresist layer 15. Under illuminations of the three different intensities, three different etching speeds are on the photoresist layer 15. When the anode thin film layers 13 are exposed on the position of the fastest etching speed, the photolithography is stopped, and then performing baking and curing to form the first bank layer 19. Furthermore, the first bank layer 19 is a structure that its middle section is thick, and its edge sections are thin and equal (as shown in FIG. 5).

In another embodiment, light transmittance rates of the first half via holes 173 and the second half via holes 177 are different, so in the photolithography process of the photoresist layer 15, lights with four intensities illustrate on the photoresist layer 15. Under illuminations of the four different intensities, four different etching speeds are on the photoresist layer 15. When the anode thin film layers 13 are exposed on the position of the fastest etching, the photolithography is stopped, and then performing baking and curing to form the first bank layer 19. Furthermore, the first bank layer 19 is a structure that its middle section is thick, and its edge sections are thin and not equal (as shown in FIG. 6).

In an embodiment, the first half via holes 173 and the second half via holes 177 on the exposing patterning structure 17 are grayscale masks (half tone masks, HTMs). Furthermore, the light transmittance rates of the first half via holes 173 and the second half via holes 177 can be same, or can be different. The transmittance rate of the grayscale mask can be set according to an actual requirement.

Figure 7:
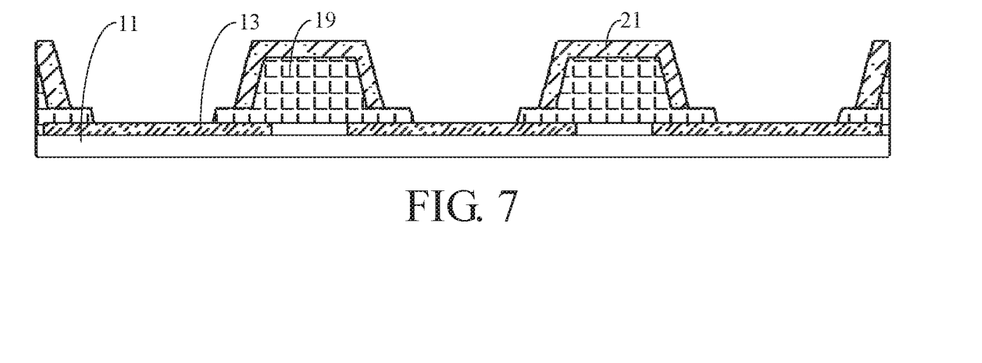
FIG. 7 is a process schematic diagram of manufacturing a second bank layer of an embodiment.

Step S140: forming a second bank layer 21 on the first bank layer 19 (as shown in FIG. 7). The second bank layer 21 is a black bank layer.

It should be noted that after forming the first bank layer 19, forming the second bank layer 21 on the first bank layer 19. Specifically, the second bank layer 21 covers the middle section of the first bank layer 19. The second bank layer 21 is a black bank layer, and it is made of a black photoresist material.

Figure 8:
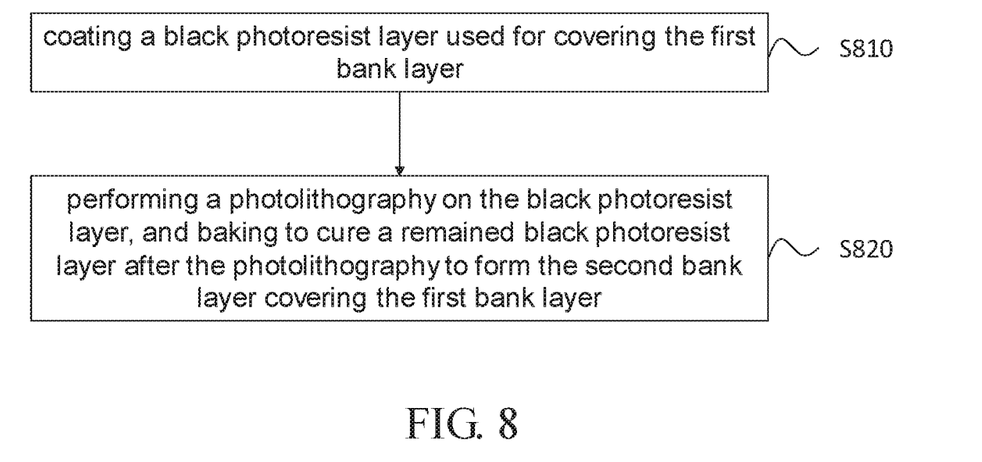
FIG. 8 is a flowchart of manufacturing the second bank layer of an embodiment.

In an embodiment, during the step of forming the second bank layer 21 on the first bank layer 19, as illustrated in FIG. 8, it includes steps:

Step S810: coating a black photoresist layer used for covering the first bank layer 19.

Step S820: performing a photolithography on the black photoresist layer, and baking to cure a remained black photoresist layer after the photolithography to form the second bank layer 21 covering the first bank layer 19.

The pixel bank manufacturing method provided by each embodiment of the present disclosure are through steps as follow: providing a base substrate 11, wherein anode thin film layers 13 are manufactured on the base substrate 11; coating a photoresist layer 15 used for covering the anode thin film layers 13 on the base substrate 11; performing a photolithography on the photoresist layer 15 by an exposing patterning structure 17, and baking to cure a remained photoresist layer 15 after the photolithography to form a first bank layer 19; the exposing patterning structure 17 is a structure that full via holes 171, first half via holes 173, blind via holes 175, and second half via holes 177 are arranged repeatedly; forming a second bank layer 21 on the first bank layer 19; the second bank layer 21 is a black bank layer. By the full via holes 171, the first half via holes 173, the blind via holes 175, and the second half via holes 177 of the exposing patterning structure 17, using light with different intensities to perform the photolithography on the photoresist layer 15 can be realized, so the thickness of the middle section of the formed first bank layer 19 is thick, and the thickness of the edge sections of the formed first bank layer 19 is thin. After that, forming the second bank layer 21 on the first bank layer 19, because the thickness of the middle section of the first bank layer 19 is thick, a height of the second bank layer 21 is raised. Furthermore, a characteristic of shielding light by a black color of the second bank layer 21 is used to reduce a risk of light leakage. Moreover, because the pixel bank manufacturing method of the present disclosure omits ashing processes in traditional bank manufacturing process, production and manufacturing cost is lowered, and production and manufacturing time is reduced.

In one of the embodiments, the pixel bank manufacturing method, includes the following steps:

Providing a base substrate 11, and a plurality of anode thin film layers 13 are manufactured on the base substrate 11.

Coating a photoresist layer 15 used for covering the anode thin film layers 13 on the base substrate 11. The photoresist layer 15 is a positive photoresist layer 15.

Performing a photolithography on the photoresist layer 15 by an exposing patterning structure 17, and baking to cure a remained photoresist layer 15 after the photolithography to form a first bank layer 19. The exposing patterning structure 17 is a structure that full via holes 171, first half via holes 173, blind via holes 175, and second half via holes 177 are arranged repeatedly. The full via holes 171 are directly aligned to a middle region of the anode thin film layers 13. The first half via holes 173 and the second half via holes 177 are respectively directly aligned to edge regions on two sides of the anode thin film layers 13. The blind via holes 175 are directly aligned to gap regions between adjacent two anode thin film layers 13.

Forming a second bank layer 21 on the first bank layer 19. The second bank layer 21 is a black bank layer.

It should be noted that all light penetrates through the full via holes 171, a part of the light penetrates through the half via holes, and the light cannot penetrate the blind via holes 175. In the photolithography process of the photoresist layer 15, the full via holes 171 are directly aligned to a middle region of the anode thin film layers 13, the first half via holes 173 and the second half via holes 177 are respectively directly aligned to edge regions on two sides of the anode thin film layers 13, and the blind via holes 175 are directly aligned to gap regions between adjacent two anode thin film layers 13. In an embodiment, light transmittance rates of the first half via holes 173 and the second half via holes 177 are same. Therefore, in the photolithography process of the photoresist layer 15, an etching speed at the part of irradiation through the full via holes 171 is the fastest, etching speeds at the parts of irradiation through the first half via holes 173 and the second half via holes 177 are the second, and an etching speed corresponds to the blind via hole 175 is the slowest. When the anode thin film layers 13 are exposed at the part of irradiation through the first half via holes 171, stopping the photolithography, and then performing baking and curing to form the first bank layer 19. Furthermore, the first bank layer 19 is a structure that its middle section is thick, and its edge sections are thin and equal.

In an embodiment, light transmittance rates of the first half via holes 173 and the second half via holes 177 are different. For example, the light transmittance rate of the first half via holes 173 is greater than the light transmittance rate of the second half via holes 177. Therefore, in the photolithography process of the photoresist layer 15, an etching speed at the part of irradiation through the full via holes 171 is the fastest, an etching speeds at the parts of irradiation through the first half via holes 173 is the second, an etching speeds at the parts of irradiation through the second half via holes 177 is the third, and an etching speed corresponds to the blind via hole 175 is the slowest. When the anode thin film layers 13 are exposed at the part of irradiation through the full via holes 171, stopping the photolithography, and then performing baking and curing to form the first bank layer 19. Furthermore, the first bank layer 19 is a structure that its middle section is thick, and its edge sections are thin and not equal, that is, the thickness of the edge sections corresponding to the first half via holes 173 is less than the thickness of the edge sections corresponding to the second half via holes 177.

In each embodiment of the pixel bank manufacturing method of the present disclosure, by the full via holes 171, the first half via holes 173, the blind via holes 175, and the second half via holes 177 of the exposing patterning structure 17, using light with different intensities to perform the photolithography on the photoresist layer 15 can be realized. The thickness of the middle section of the formed first bank layer 19 is thick, and the thickness of the edge sections of the formed first bank layer 19 is thin. Because the thickness of the middle section of the first bank layer 19 is thick, a height of the second bank layer 21 is raised. Furthermore, a characteristic of shielding light by a black color of the second bank layer 21 is used to reduce a risk of light leakage. Moreover, because the pixel bank manufacturing method of the present disclosure omits ashing processes in traditional bank manufacturing process, production and manufacturing cost is lowered, and production and manufacturing time is reduced.

In an embodiment, the pixel bank manufacturing method includes the following steps:

Providing a base substrate 11, and a plurality of anode thin film layers 13 are manufactured on the base substrate 11.

Coating a photoresist layer 15 used for covering the anode thin film layers 13 on the base substrate 11. The photoresist layer 15 is a negative photoresist layer 15.

Performing a photolithography on the photoresist layer 15 by an exposing patterning structure 17, and baking to cure a remained photoresist layer 15 after the photolithography to form a first bank layer 19. The exposing patterning structure 17 is a structure that full via holes 171, first half via holes 173, blind via holes 175, and second half via holes 177 are arranged repeatedly. The blind via holes 175 are directly aligned to a middle region of the anode thin film layers 13. The first half via holes 173 and the second half via holes 177 are respectively directly aligned to edge regions on two sides of the anode thin film layers 13. The full via holes 171 are directly aligned to gap regions between adjacent two anode thin film layers 13.

Forming a second bank layer 21 on the first bank layer 19. The second bank layer 21 is a black bank layer.

It should be noted that the all of light penetrates through the full via holes 171, a part of the light penetrates through the half via holes, and the light cannot penetrate the blind via holes 175. In the photolithography process of the photoresist layer 15, the blind via holes 175 are directly aligned to a middle region of the anode thin film layers 13, the first half via holes 173 and the second half via holes 177 are directly aligned to edge regions on two sides of the anode thin film layers 13 respectively, and the full via holes 171 are directly aligned to gap regions between adjacent two anode thin film layers 13. In an embodiment, light transmittance rates of the first half via holes 173 and the second half via holes 177 are same. Therefore, in the photolithography process of the photoresist layer 15, an etching speed of the part corresponding to the blind via holes 175 is the fastest, etching speeds at the parts of irradiation through the first half via holes 173 and the second half via holes 177 are the second, and an etching speed at the parts of irradiation through the full via holes 175 is the slowest. When the anode thin film layers 13 are exposed at the part corresponding to the blind via holes 175, stopping the photolithography, and then performing baking and curing to form the first bank layer 19. Furthermore, the first bank layer 19 is a structure that its middle section is thick, and its edge sections are thin and equal.

In an embodiment, light transmittance rates of the first half via holes 173 and the second half via holes 177 are different. For example, the light transmittance rate of the first half via holes 173 is less than the light transmittance rate of the second half via holes 177. Therefore, in the photolithography process of the photoresist layer 15, an etching speed at the part corresponding to the blind via holes 175 is the fastest, an etching speeds at the parts of irradiation through the first half via holes 173 is the second, an etching speeds at the parts of irradiation through the second half via holes 177 is the third, and an etching speed at the parts of irradiation through the full via holes 171 is the slowest. When the anode thin film layers 13 are exposed at the part of irradiation through the full via holes 171, stopping the photolithography, and then performing baking and curing to form the first bank layer 19. Furthermore, the first bank layer 19 is a structure that its middle section is thick, and its edge sections are thin and not equal, that is, the thickness of the edge sections corresponding to the first half via holes 173 is less than the thickness of the edge sections corresponding to the second half via holes 177.

In each embodiment of the pixel bank manufacturing method of the present disclosure, by the full via holes 171, the first half via holes 173, the blind via holes 175, and the second half via holes 177 of the exposing patterning structure 17, using light with different intensities to perform the photolithography on the photoresist layer 15 can be realized. The thickness of the middle section of the formed first bank layer 19 is thick, and the thickness of the edge sections of the formed first bank layer 19 is thin. Because the thickness of the middle section of the first bank layer 19 is thick, a height of the second bank layer 21 is raised. Furthermore, a characteristic of shielding light by a black color of the second bank layer 21 is used to reduce a risk of light leakage. Moreover, because the pixel bank manufacturing method of the present disclosure omits ashing processes in traditional bank manufacturing process, production and manufacturing cost is lowered, and production and manufacturing time is reduced.

It should be understood that although each of the steps of the flowcharts of FIG. 1 and FIG. 8 may be displayed in succession as indicated by an arrow, these steps may not necessarily be executed in succession in the order indicated by the arrows. Unless expressly described herein, the execution of these steps may not be limited to a strict order; instead, the steps can be executed in another order. In addition, at least some steps in FIG. 1 and FIG. 8 may include multiple sub-steps or multiple stages. These sub-steps or stages may not necessarily be executed or completed at the same moment, but can be executed at different times, and the order of execution thereof may also not necessarily be in succession, but can be executed in turn or alternately with at least some other steps or sub-steps or stages of other steps.

Figure 9:
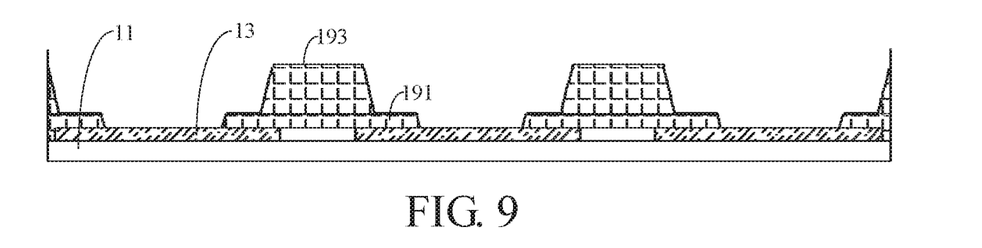
FIG. 9 is a structural schematic diagram of the first bank layer of an embodiment.
Figure 10:
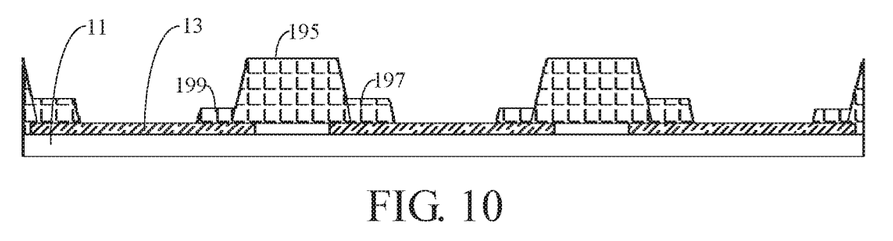
FIG. 10 is a structural schematic diagram of the first bank layer of another embodiment.

In an embodiment, as illustrated in FIG. 9 or FIG. 10, a pixel bank structure, including a first bank layer 19 and a second bank layer 21. A thickness of a middle section of the first bank layer 19 is greater than a thickness of an edge section of the first bank layer 19.

The middle section of the first bank layer 19 covers a gap section between two adjacent anode thin film layers 13 on the base substrate 11, and the edge section of the first bank layer 19 covers an edge section of a plurality of anode thin film layers 13.

The second bank layer 21 covers the first bank layer 19.

It should be noted that the pixel bank structure is manufactured by using the bank manufacturing method provided by each embodiment of the bank manufacturing method of the present disclosure.

In an embodiment, as illustrated in FIG. 9, the first bank layer 19, which is formed by using the exposing patterning structure 17 with the first half via holes 173 and the second half via holes 177 having the same light transmittance rates to perform the photolithography on the photoresist layer 15, includes a first trapezoidal layer 191 and a second trapezoidal layer 193.

A middle section of the first trapezoidal layer 191 covers the gap section between the two adjacent anode thin film layers 13, and an edge section of the first trapezoidal layer 191 covers the edge section of the plurality of anode thin film layers 13. The second trapezoidal layer 193 is stacked on the first trapezoidal layer 191.

A groove having a shape same as the second trapezoidal layer 193 is defined on the second bank layer 21, and a shape of the second bank layer 21 is a trapezoidal shape. The second bank layer 21 is covered on the second trapezoidal layer 193 by the groove.

In another embodiment, as illustrated in FIG. 10, the first bank layer 19, which is formed by using the exposing patterning structure 17 with the first half via holes 173 and the second half via holes 177 having different light transmittance rates to perform the photolithography on the photoresist layer 15, includes a third trapezoidal layer 195, a first parallelogram layer 197, and a second parallelogram layer 199.

A middle section of the third trapezoidal layer 195 covers the gap section between the two adjacent anode thin film layers 13. The first parallelogram layer 197 and the second parallelogram layer 199 are respectively distributed on two sides of the third trapezoidal layer 195. The first parallelogram layer 197 covers the edge section of the plurality of anode thin film layers 13. The second parallelogram layer 199 covers the edge section of the plurality of anode thin film layers 13.

A groove having a shape same as the third trapezoidal layer 195 is defined on the second bank layer 21, and a shape of the second bank layer 21 is a trapezoidal shape. The second bank layer 21 is covered on the third trapezoidal layer 195 by the groove.

In each of the embodiments of the pixel bank structure of the present disclosure, a light shielding height of the pixel bank structure is high, so the risk of light leakage can be effectively reduced.

In an embodiment, a pixel structure is further provided, wherein organic light emitting diode (OLED) devices are formed in the pixel bank structure mentioned in each of the embodiment of the pixel bank structure of the present disclosure.

It should be noted that the pixel bank structure in this embodiment is same as the pixel bank structure mentioned in each of the embodiments of the pixel bank structure of the present disclosure, and detailed description please refer to each of the embodiments of the pixel bank structure of the present disclosure, and redundant description will not be mentioned herein.

The OLED devices formed in the pixel bank structure sequentially include a hole injection layer, a hole transport layer, a light emitting layer, an electron transport layer, an electron injection layer, and a cathode which are formed sequentially.

In each of the embodiments of the pixel structure of the present disclosure, light shielding performance between pixels is good, and light leakage cannot occur.

In an embodiment, a display panel is further provided, and it includes the pixel structure mentioned above.

It should be noted that the pixel structure in this embodiment is same as the pixel structure mentioned in each of the embodiments of the pixel structure of the present disclosure, and detailed description please refer to each of the embodiments of the pixel structure of the present disclosure, and redundant description will not be mentioned herein.

In an embodiment, a display device is further provided, and it includes the display panel mentioned above.

It should be noted that the display panel in this embodiment is same as the display panel mentioned in each of the embodiments of the display panel of the present disclosure, and detailed description please refer to each of the embodiments of the display panel of the present disclosure, and redundant description will not be mentioned herein.

The technical features of the above-mentioned embodiments may be arbitrarily combined. For the sake of brevity of description, all possible combinations of the technical features in the above-mentioned embodiments are not described. However, as long as there is no contradiction between the combinations of these technical features, all should be considered as the scope of this manual.

The above-mentioned embodiments demonstrate some embodiment means of the present disclosure, and are described in details and in specific, but should not restrict the scope of the present disclosure. It should be noted that without departing from the conception of the present disclosure, those skilled in the art may be able to make transformation and improvement of the present disclosure within the scope. Therefore, the scope of the present disclosure is defined by the claims.

What is claimed is:

1. A pixel bank manufacturing method, comprising following steps:
   providing a base substrate, wherein a plurality of anode thin film layers are manufactured on the base substrate;
   coating a photoresist layer used for covering the plurality of anode thin film layers on the base substrate;
   performing a photolithography on the photoresist layer by an exposing patterning structure, and baking to cure a remained photoresist layer after the photolithography to form a first bank layer, wherein the exposing patterning structure is a structure that a plurality of full via holes, a plurality of first half via holes, a plurality of blind via holes, and a plurality of second half via holes are arranged repeatedly; and
   forming a second bank layer on the first bank layer, wherein the second bank layer is a black bank layer; and
   wherein the first bank layer comprises a middle section and an edge section adjacent to the middle section, a thickness of the middle section is greater than a thickness of the edge section, and the second bank layer covers a top surface and lateral surfaces of the middle section of the first bank layer.

2. The pixel bank manufacturing method as claimed in claim 1, wherein the photoresist layer is a positive photoresist layer,
   the plurality of full via holes are directly aligned to a middle region of the plurality of anode thin film layers; the plurality of first half via holes and the plurality of second half via holes are respectively directly aligned to a plurality of edge regions on two sides of the plurality of anode thin film layers, and the plurality of blind via holes are directly aligned to a plurality of gap regions between adjacent two anode thin film layers.

3. The pixel bank manufacturing method as claimed in claim 1, wherein the photoresist layer is a negative photoresist layer;
   the plurality of blind via holes are directly aligned to a middle region of the anode thin film layer; the plurality of first half via holes and the plurality of second half via holes are respectively directly aligned to a plurality of edge regions on two sides of the anode thin film layer, and the plurality of full via holes are directly aligned to a plurality of gap regions between adjacent two anode thin film layers.

4. The pixel bank manufacturing method as claimed in claim 1, wherein the plurality of first half via holes and the plurality of second half via holes are grayscale masks, and light transmittance rates of the plurality of first half via holes and the plurality of second half via holes are same.

5. The pixel bank manufacturing method as claimed in claim 2, wherein the plurality of first half via holes and the plurality of second half via holes are grayscale masks, and light transmittance rates of the plurality of first half via holes and the plurality of second half via holes are same.

6. The manufacturing method of the pixel bank as claimed in claim 3, wherein the plurality of first half via holes and the plurality of second half via holes are grayscale masks, and light transmittance rates of the plurality of first half via holes and the plurality of second half via holes are same.

7. The pixel bank manufacturing method as claimed in claim 1, wherein in the step of forming the second bank layer on the first bank layer comprises steps:

coating a black photoresist layer used for covering the first bank layer; and performing a photolithography on the black photoresist layer, and baking to cure a remained black photoresist layer after the photolithography to form the second bank layer covering the first bank layer.

8. The pixel bank manufacturing method as claimed in claim 2, wherein in the step of forming the second bank layer on the first bank layer comprises steps:

coating a black photoresist layer used for covering the first bank layer; and performing a photolithography on the black photoresist layer, and baking to cure a remained black photoresist layer after the photolithography to form the second bank layer covering the first bank layer.

9. The pixel bank manufacturing method as claimed in claim 3, wherein in the step of forming the second bank layer on the first bank layer comprises steps:

coating a black photoresist layer used for covering the first bank layer; and performing a photolithography on the black photoresist layer, and baking to cure a remained black photoresist layer after the photolithography to form the second bank layer covering the first bank layer.

10. A pixel bank structure, comprising a first bank layer and a second bank layer, wherein the first bank layer comprises a middle section and an edge section adjacent to the middle section, a thickness of the middle section of the first bank layer is greater than a thickness of the edge section of the first bank layer;

wherein the middle section of the first bank layer covers a gap section between two adjacent anode thin film layers, and the edge section of the first bank layer covers an edge section of a plurality of anode thin film layers; and whereinthe second bank layer covers a top surface and lateral surfaces of the middle section of the first bank layer.

11. The pixel bank structure as claimed in claim 10, wherein the first bank layer comprises a first trapezoidal layer and a second trapezoidal layer;

a middle section of the first trapezoidal layer covers the gap section between the two adjacent anode thin film layers, an edge section of the first trapezoidal layer covers the edge section of the plurality of anode thin film layers, and the second trapezoidal layer is stacked on the first trapezoidal layer; and a groove having a shape same as the second trapezoidal layer is defined on the second bank layer, a shape of the second bank layer is a trapezoidal shape, and the second bank layer is covered on the second trapezoidal layer by the groove.

12. A pixel structure, wherein organic light emitting diode (OLED) devices are formed in a pixel bank structure, wherein the pixel bank structure comprises:

a first bank layer and a second bank layer, wherein the first bank layer comprises a middle section and an edge section adjacent to the middle section, a thickness of the middle section of the first bank layer is greater than a thickness of the edge section of the first bank layer;

wherein the middle section of the first bank layer covers a gap section between two adjacent anode thin film layers, and the edge section of the first bank layer covers an edge section of a plurality of anode thin film layers; and wherein the second bank layer covers a top surface and lateral surfaces of the middle section of the first bank layer.

13. The pixel structure as claimed in claim 12, wherein the first bank layer comprises a first trapezoidal layer and a second trapezoidal layer;

a middle section of the first trapezoidal layer covers the gap section between the two adjacent anode thin film layers, an edge section of the first trapezoidal layer covers the edge section of the plurality of anode thin film layers, and the second trapezoidal layer is stacked on the first trapezoidal layer; and a groove having a shape same as the second trapezoidal layer is defined on the second bank layer, a shape of the second bank layer is a trapezoidal shape, and the second bank layer is covered on the second trapezoidal layer by the groove.

* * * * *